(12) United States Patent
Oshiyama et al.

(10) Patent No.: US 10,361,242 B2
(45) Date of Patent: Jul. 23, 2019

(54) SOLID-STATE IMAGING DEVICE AND METHOD OF PRODUCING SOLID-STATE IMAGING DEVICE

(71) Applicant: Sony Corporation, Tokyo (JP)

(72) Inventors: Itaru Oshiyama, Kanagawa (JP); Yuki Miyanami, Kanagawa (JP); Susumu Hiyama, Kanagawa (JP); Kazuki Tanaka, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/835,791

(22) Filed: Dec. 8, 2017

(65) Prior Publication Data

US 2018/0175099 A1   Jun. 21, 2018

Related U.S. Application Data

(63) Continuation of application No. 12/544,914, filed on Aug. 20, 2009, now abandoned.

(30) Foreign Application Priority Data

Sep. 10, 2008 (JP) .................. 2008-231780

(51) Int. Cl.
*H01L 27/146* (2006.01)
(52) U.S. Cl.
CPC .... *H01L 27/14683* (2013.01); *H01L 27/1463* (2013.01)
(58) Field of Classification Search
CPC .................................................. H01L 27/1463
See application file for complete search history.

(56) References Cited

U.S. PATENT DOCUMENTS

| | | | |
|---|---|---|---|
| 5,190,838 A | 3/1993 | Saitoh et al. | |
| 5,485,019 A * | 1/1996 | Yamazaki | H01L 27/1214 257/57 |
| 5,489,542 A | 2/1996 | Iwai et al. | |
| 5,595,638 A * | 1/1997 | Konuma | C25D 11/02 205/106 |
| 5,963,279 A * | 10/1999 | Taguchi | G02F 1/1362 257/E27.111 |
| 6,885,047 B2 * | 4/2005 | Shinohara | H01L 27/14609 257/233 |
| 7,122,415 B2 * | 10/2006 | Jang | H01L 21/02164 438/201 |

(Continued)

FOREIGN PATENT DOCUMENTS

| | | |
|---|---|---|
| CN | 1897254 A | 1/2007 |
| CN | 101079967 A | 11/2007 |

(Continued)

OTHER PUBLICATIONS

Japanese Office Action dated Feb. 26, 2013 for corresponding Japanese Application No. 2008-231780.

(Continued)

*Primary Examiner* — Cynthia Segura
(74) *Attorney, Agent, or Firm* — Michael Best & Friedrich LLP

(57) ABSTRACT

A solid-state imaging device includes a sensor including an impurity diffusion layer provided in a surface layer of a semiconductor substrate; and an oxide insulating film containing carbon, the oxide insulating film being provided on the sensor.

18 Claims, 7 Drawing Sheets

(56) References Cited

U.S. PATENT DOCUMENTS

| | | | |
|---|---|---|---|
| 7,205,197 B2* | 4/2007 | Yoshida | H01L 21/28273 257/E21.179 |
| 7,294,583 B1* | 11/2007 | Rulkens | C23C 16/401 257/E21.278 |
| 7,863,076 B2* | 1/2011 | Hiyama | H01L 27/14601 257/E27.153 |
| 7,968,365 B2* | 6/2011 | Hiyama | H01L 27/14601 257/E27.13 |
| 8,217,479 B2* | 7/2012 | Oshiyama | H01L 27/14632 257/431 |
| 8,508,634 B2* | 8/2013 | Oshiyama | H01L 27/14601 348/222.1 |
| 8,946,840 B2* | 2/2015 | Oshiyama | H01L 27/1461 257/432 |
| 9,337,226 B2* | 5/2016 | Manda | H01L 27/14621 |
| 2003/0129828 A1* | 7/2003 | Cohen | H01L 21/76843 438/629 |
| 2003/0219632 A1* | 11/2003 | Schaepkens | C23C 16/345 428/698 |
| 2003/0236001 A1* | 12/2003 | Shinriki | C23C 16/0272 438/785 |
| 2004/0004271 A1 | 1/2004 | Fukuda et al. | |
| 2004/0135255 A1* | 7/2004 | Matsunaga | H01L 21/76801 257/758 |
| 2004/0262609 A1* | 12/2004 | Mouli | H01L 27/14603 257/72 |
| 2005/0151218 A1* | 7/2005 | Mouli | H01L 27/1463 257/446 |
| 2005/0161827 A1 | 7/2005 | Andideh et al. | |
| 2005/0266180 A1* | 12/2005 | Bi | B41M 5/52 428/32.34 |
| 2005/0274994 A1* | 12/2005 | Rhodes | H01L 27/14603 257/291 |
| 2006/0088660 A1* | 4/2006 | Putkonen | C23C 16/409 427/248.1 |
| 2006/0094185 A1 | 5/2006 | Jeong et al. | |
| 2006/0266291 A1* | 11/2006 | Song | C23C 14/0036 |
| 2007/0012963 A1* | 1/2007 | Han | H01L 27/14603 257/290 |
| 2007/0034892 A1* | 2/2007 | Song | H01L 33/0075 257/103 |
| 2007/0034981 A1* | 2/2007 | Saito | H01L 27/14609 257/462 |
| 2007/0105399 A1* | 5/2007 | Lee | H01L 21/28185 438/778 |
| 2007/0210395 A1* | 9/2007 | Maruyama | H01L 27/14609 257/431 |
| 2007/0241390 A1* | 10/2007 | Tanaka | H01L 27/115 257/314 |
| 2008/0106925 A1* | 5/2008 | Paz de Araujo | H01L 45/04 365/148 |
| 2008/0206539 A1* | 8/2008 | Kobrin | B81B 3/0075 428/220 |
| 2008/0246107 A1* | 10/2008 | Maehara | H01L 27/1462 257/432 |
| 2009/0035523 A1* | 2/2009 | Takayanagi | C03C 15/00 428/156 |
| 2009/0078937 A1* | 3/2009 | Saito | H01L 27/1285 257/59 |
| 2009/0209056 A1* | 8/2009 | Hiyama | H01L 27/14601 438/57 |
| 2010/0055905 A1* | 3/2010 | Kher | C23C 16/0272 438/681 |
| 2010/0068489 A1* | 3/2010 | Kobrin | B81B 3/0075 428/220 |
| 2010/0224946 A1* | 9/2010 | Oshiyama | H01L 27/14601 257/432 |
| 2011/0025872 A1* | 2/2011 | Oshiyama | H01L 27/14601 348/222.1 |
| 2011/0089313 A1* | 4/2011 | Oshiyama | H01L 27/1461 250/208.1 |
| 2014/0103335 A1* | 4/2014 | Yamazaki | H01L 29/7869 257/43 |
| 2014/0151687 A1* | 6/2014 | Yamazaki | H01L 29/66969 257/43 |
| 2014/0209896 A1* | 7/2014 | Yamazaki | H01L 29/66969 257/43 |
| 2015/0091121 A1* | 4/2015 | Manda | H01L 27/14621 257/443 |
| 2015/0123226 A1* | 5/2015 | Choi | H01L 27/1464 257/432 |
| 2017/0362121 A1* | 12/2017 | Maillet | C03C 17/22 |
| 2018/0158857 A1* | 6/2018 | Oshiyama | G02B 1/115 |

FOREIGN PATENT DOCUMENTS

| | | |
|---|---|---|
| JP | 2000-174245 A | 6/2000 |
| JP | 2003-338615 | 11/2003 |
| JP | 2006-128383 A | 5/2006 |
| JP | 2007-258684 A | 10/2007 |
| JP | 2008-103572 A | 5/2008 |

OTHER PUBLICATIONS

Chinese Office Action dated Feb. 28, 2014 for corresponding Chinese Application No. 201110434273.3.

* cited by examiner

× · · · INTERFACE STATE

×···INTERFACE STATE

SOLID-STATE IMAGING DEVICE AND METHOD OF PRODUCING SOLID-STATE IMAGING DEVICE

CROSS REFERENCES TO RELATED APPLICATIONS

This is a Continuation Application of U.S. patent application Ser. No.: 12/544,914, filed Aug. 20, 2009, which claims priority to Japanese Patent Application No.: 2008-231780, filed Sep. 10, 2008, the entire contents of which being incorporated herein by reference.

BACKGROUND OF THE INVENTION

1. Field of the Invention

The present invention relates to a solid-state imaging device and a method of producing a solid-state imaging device. In particular, the present invention relates to a solid-state imaging device in which an interface state of a surface of a semiconductor substrate having a sensor that performs photoelectric conversion can be compensated for.

2. Description of the Related Art

It is known that, in a solid-state imaging device such as a CCD or CMOS image sensor, crystal defects in the sensor composed of a photodiode and an interface state at an interface between a surface of the sensor and a film disposed thereon become causes of generation of dark current. A hole accumulated diode (HAD) structure is known as a technology for suppressing the generation of dark current due to the interface state, which is one of the above causes.

FIG. 8A shows a structure to which the HAD structure is not applied. In the structure shown in FIG. 8A, the upper portion of a sensor 203 formed on a surface side of a semiconductor substrate 201 is directly covered with an insulating film 205. Consequently, electrons generated due to an interface state formed at an interface between the sensor 203 and the insulating film 205 flow in the sensor 203 in the form of dark current. In contrast, FIG. 8B shows a structure to which the HAD structure is applied. In the structure shown in FIG. 8B, a hole accumulation layer 207 composed of a P-type diffusion layer is provided on a sensor 203 to cover a surface of a semiconductor substrate 201, and an insulating film 205 is provided on the hole accumulation layer 207. Consequently, electrons generated due to an interface state between the hole accumulation layer 207 constituting the surface of the semiconductor substrate and the insulating film 205 disappear in the hole accumulation layer 207, thus preventing generation of dark current.

Such an HAD structure described above can be used in either a CCD image sensor or a CMOS image sensor. Furthermore, the HAD structure can be applied not only to a surface irradiation-type image sensor in the related art but also to a rear-surface irradiation-type image sensor (refer to, for example, Japanese Unexamined Patent Application Publication No. 2003-338615).

SUMMARY OF THE INVENTION

In order to form the above-mentioned hole accumulation layer 207, an annealing treatment at a high temperature of 700° C. or higher is necessary in order to activate an impurity introduced in a surface layer of the semiconductor substrate 201. Accordingly, it is difficult to form the hole accumulation layer 207 by performing only a process at a low temperature of 400° C. or lower. In addition, in the annealing treatment at a high temperature of 700° C. or higher, diffusion of an impurity occurs in another impurity layer that has already been formed.

Furthermore, in order to efficiently read charges accumulated in the sensor 203, it is desirable that the sensor 203 be formed at a position within the semiconductor substrate 201 that is as shallow as possible. Accordingly, it is desirable that the hole accumulation layer 207 formed in the upper portion of the sensor 203 have a small thickness so as to satisfy this desire.

However, there is a trade-off relationship between the depth of the hole accumulation layer 207 and dark current due to the interface state at the surface of the HAD structure. Accordingly, decreasing the thickness of the hole accumulation layer 207 is a factor of increasing the dark current. In addition, as the depth of the hole accumulation layer 207 decreases, variations increase and thus an effect on an increase in the dark current increases.

Accordingly, it is desirable to provide a solid-state imaging device in which dark current due to an interface state can be decreased without providing a hole accumulation layer composed of an impurity diffusion layer, thereby providing a sensor at a shallow position within a semiconductor substrate to improve a charge transfer efficiency, and a method of producing the same.

A solid-state imaging device according to an embodiment of the present invention includes a sensor including an impurity diffusion layer provided in a surface layer of a semiconductor substrate; and an oxide insulating film containing carbon, the oxide insulating film being provided on the sensor. This oxide insulating film is provided as a negative-charge accumulation layer having a negative fixed charge and is composed of a metal oxide or a silicon-based material. The carbon concentration is preferably $6 \times 10^{19}$ atoms/cm$^3$ or more.

In a method of producing a solid-state imaging device according to an embodiment of the present invention, a sensor including an impurity diffusion layer is formed in a surface layer of a semiconductor substrate, and an oxide insulating film containing carbon is then deposited on the sensor. In this step, the carbon concentration in the oxide insulating film is controlled by changing a flow rate ratio of a material gas containing carbon and the deposition temperature.

In the solid-state imaging device having the above structure, the oxide insulating film containing carbon is provided on the sensor. The oxide insulating film containing carbon functions as a negative-charge accumulation layer having a negative fixed charge. Consequently, by providing the oxide insulating film on the sensor, positive charges can be efficiently attracted to the surface side of the semiconductor substrate by a negative band-bending effect in the oxide insulating film. Consequently, a hole accumulation layer is formed in this portion, thus compensate for the interface state. Furthermore, the amount of negative fixed charge in the oxide insulating film is controlled by the carbon concentration. Accordingly, the hole accumulation layer can be reliably formed on the surface side of the semiconductor substrate by a sufficient band-bending effect.

As described above, according to the solid-state imaging device according to an embodiment of the present invention, by providing an oxide insulating film having a sufficient negative band-bending effect obtained by controlling the carbon concentration, a hole accumulation layer can be reliably formed in a surface layer of a semiconductor substrate having a sensor, and thus an interface state can be compensated for. Accordingly, generation of dark current and white spots can be prevented by constituting an HAD structure without providing on a surface of a sensor a hole accumulation layer being composed of an impurity diffusion layer which is formed by performing a heat treatment at a high temperature. As a result, the sensor can be provided at a shallow position in a surface of a semiconductor substrate, thereby increasing a transfer efficiency of charges to a floating diffusion portion which is disposed on a side of the sensor with a gate electrode provided between the sensor and the floating diffusion portion.

DESCRIPTION OF THE PREFERRED EMBODIMENTS

Embodiments of the present invention will now be described in detail with reference to the drawings.
First Embodiment
(Embodiment in which Oxide Insulating Film is Composed of Metal Oxide)
[Structure of Solid-State Imaging Device]

Figure 1A:
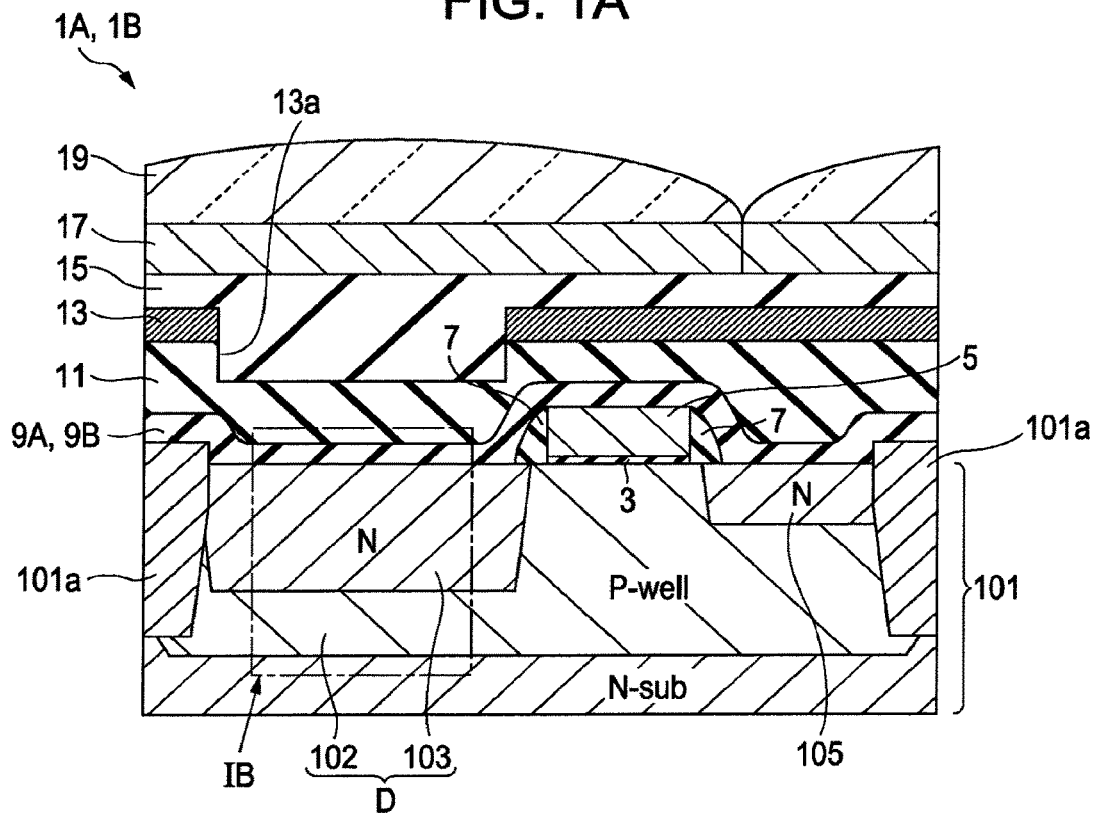
FIGS. 1A and 1B are cross-sectional views of relevant parts illustrating the structure of a solid-state imaging device of a first embodiment and a second embodiment.
Figure 1B:
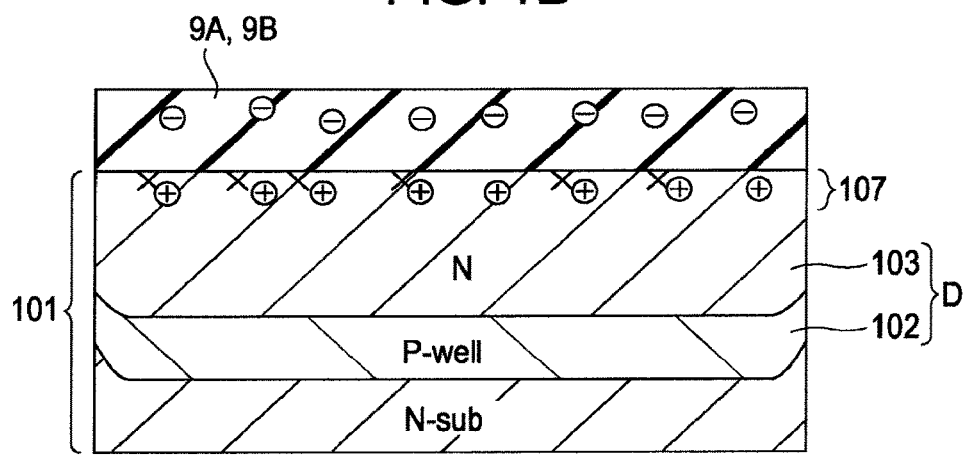

FIG. 1A is a cross-sectional view of a relevant part of one pixel in the case where a solid-state imaging device according to an embodiment of the present invention is applied to a CMOS sensor. FIG. 1B is an enlarged view of portion IB of FIG. 1A. A solid-state imaging device 1A of a first embodiment shown in FIGS. 1A and 1B has the following structure.

On a surface side of a semiconductor substrate 101 composed of N-type single-crystal silicon, for example, trench element isolations 101a (shallow trench isolations: STI) are provided to isolate each pixel region. A P-well diffusion layer 102 is provided on the surface side of the semiconductor substrate 101 in each pixel region isolated by the element isolation regions 101a. A transfer gate 5 is pattern-formed on the semiconductor substrate 101 with a gate insulating film 3 therebetween, so as to intersect the P-well diffusion layer 102. The gate insulating film 3 may be composed of, for example, a silicon oxide film or a film having a high dielectric constant such as a hafnium oxide film. The transfer gate (gate electrode) 5 may be composed of a polysilicon film or a metal material. For example, an insulating sidewall 7 is provided on each sidewall of the transfer gate 5 having the above structure. In addition to the transfer gate 5, although not shown in the figure, a reset gate, an amplifying gate, and the like are also provided on the P-well diffusion layer 102 in each pixel region.

On side of the pixel region separated by the above-described transfer gate 5 functions as a light-receiving region. An N-type diffusion layer 103 is disposed on a surface side of the P-well diffusion layer 102 in the light-receiving region. The P-well diffusion layer 102 and the N-type diffusion layer 103 constitute a diode (sensor) D. In this diode D, charges obtained by photoelectric conversion are accumulated in the N-type diffusion layer 103. Accordingly, the N-type diffusion layer 103 functions as a charge accumulation layer.

A floating diffusion portion 105 composed of an N-type diffusion layer is provided on another side of the transfer gate 5 and on the surface side of the P-well diffusion layer 102.

A peripheral region (not shown) where a drive circuit is provided is disposed around an imaging area where the pixel regions having the above-described structure are arranged. Transistors etc. constituting the drive circuit are arranged in the peripheral region.

The semiconductor substrate 101 including the element isolations 101a, the transfer gate 5, the diode D, the floating diffusion portion 105, and the transistors constituting the drive circuit is covered with an oxide insulating film 9A. This oxide insulating film 9A contains carbon, and accordingly, the oxide insulating film 9A is provided as a negative-charge accumulation layer having a negative fixed charge.

In this first embodiment, the oxide insulating film 9A is composed of a metal oxide. Among metal oxides, a material having a negative fixed charge in itself is preferable. In particular, among such metal oxides, hafnium oxide ($HfO_2$), zirconium oxide ($ZrO_2$), aluminum oxide ($Al_2O_3$), titanium oxide ($TiO_2$), or tantalum oxide ($Ta_2O_5$) is preferably used. An oxide insulating film composed of any of the above materials has been practically used as, for example, a gate insulating film of an insulated-gate field-effect transistor, and thus a deposition method thereof has been established. Accordingly, the oxide insulating film 9A composed of the above material can be easily formed.

The concentration of carbon contained in the oxide insulating film 9A is preferably $6 \times 10^{19}$ atoms/cm$^3$ or more. Accordingly, a sufficient amount of negative fixed charge is accumulated in the oxide insulating film 9A. The upper limit of the concentration of carbon contained in the oxide insulating film 9A is a range in which the amount of negative charge accumulation can be controlled by the carbon concentration, for example, $5 \times 10^{21}$ atoms/cm$^3$ or less.

Figure 2:
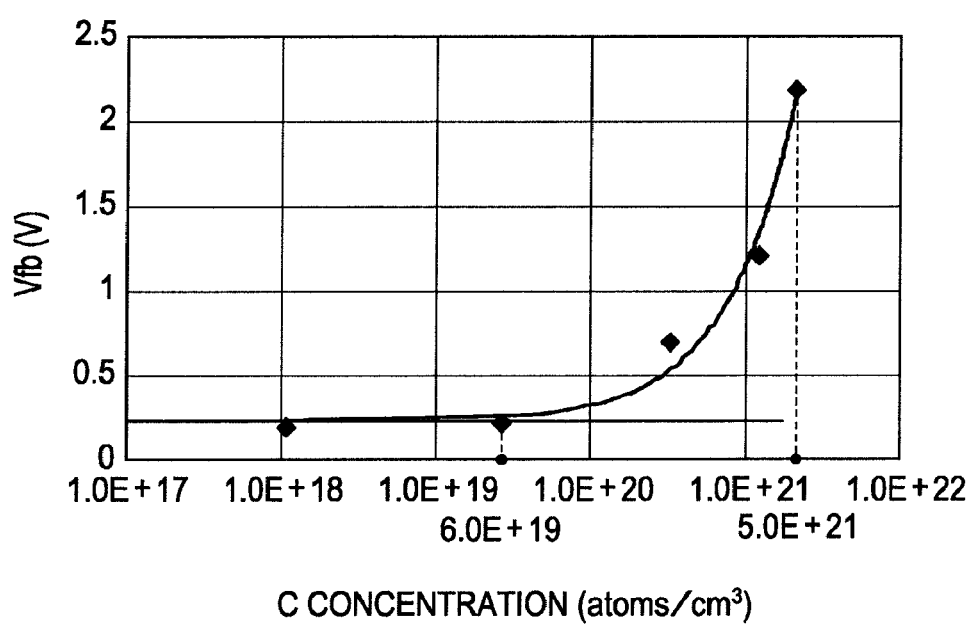
FIG. 2 is a graph showing the relationship between the carbon concentration in an oxide insulating film and the flat-band voltage (Vfb)

FIG. 2 shows, as an example, the relationship between the carbon concentration (C concentration) in an oxide insulating film 9A composed of hafnium oxide ($HfO_2$) and the flat-band voltage (Vfb). As shown in this graph, when the carbon concentration in the oxide insulating film 9A is $6 \times 10^{19}$ atoms/cm$^3$ or more, the flat-band voltage (Vfb) can be controlled in a range of 0.3 V or more. Accordingly, a negative fixed charge can be more reliably accumulated. On the other hand, when the carbon concentration in the oxide insulating film 9A is $5 \times 10^{21}$ atoms/cm$^3$ or less, the flat-band voltage (Vfb), that is, the amount of negative charge accumulation can be controlled by the carbon concentration.

Note that it is sufficient that such an oxide insulating film 9A contains carbon at least on the side that contacts the semiconductor substrate 101 (i.e., in the lower layer), and the upper layer may not contain carbon. That is, in the oxide insulating film 9A, the carbon concentration may have a gradient, and it is sufficient that the carbon concentration is controlled on the side that contacts the semiconductor substrate 101 (i.e., in the lower layer).

Furthermore, as described above, by providing the oxide insulating film 9A as a negative-charge accumulation layer, the semiconductor substrate 101 is in a state in which a hole accumulation layer 107 to which positive charges are attracted is formed in a surface layer of the diode D.

Furthermore, a light-shielding film 13 is provided on the oxide insulating film 9A with, for example, an insulating film 11 having a flat surface therebetween. The light-shielding film 13 is composed of a material having a good light-absorbing property, such as tungsten (W). The light-shielding film 13 has an opening 13a above the diode D and covers an area other than the opening 13a, thereby preventing variations in characteristics due to incidence of light on the area other than the diode D. Note that diodes D of some of pixels are covered with the light-shielding film 13. Accordingly, the black level in an image is determined by the output from the diodes D covered with the light-shielding film 13.

Furthermore, a color filter layer 17 is provided on the light-shielding film 13 with a planarizing insulating film 15 therebetween, and an on-chip lens 19 for light focusing is provided on the color filter layer 17. The color filter layer 17 and the on-chip lens 19 are pattern-formed for every pixel.

[Method of Producing Solid-State Imaging Device]

Next, a method of producing the solid-state imaging device 1A shown in FIGS. 1A and 1B will be described with reference to cross-sectional process views of FIG. 3A to 4B.

Figure 3A:
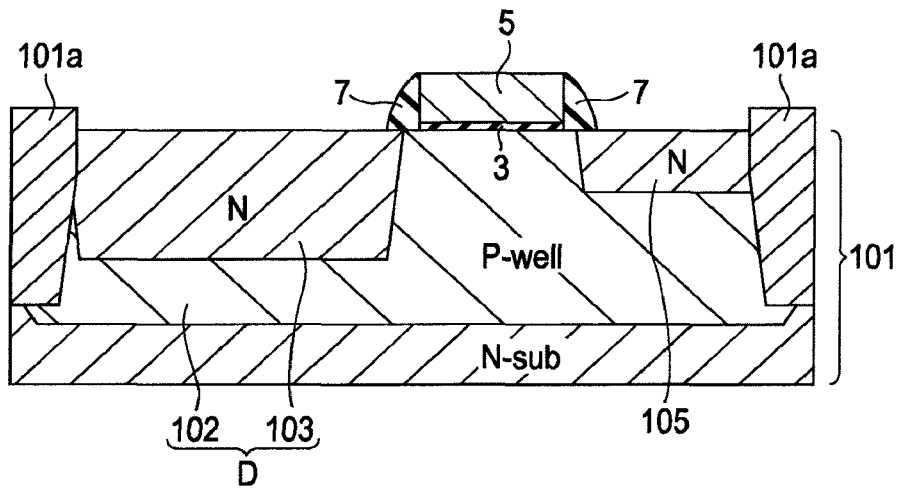
FIGS. 3A to 3C are cross-sectional process views (part 1) showing a method of producing the solid-state imaging device of the first embodiment and the second embodiment.

First, as shown in FIG. 3A, trench element isolations 101a are formed on a surface side of a semiconductor substrate 101 composed of N-type single-crystal silicon to isolate each pixel region. Next, a P-well diffusion layer 102 is formed on the surface side of the semiconductor substrate 101 in each isolated pixel region by ion implantation and subsequent heat treatment.

Subsequently, a transfer gate 5 is pattern-formed, with a gate insulating film 3 therebetween, so as to intersect each pixel region (P-well diffusion layer 102) on the semiconductor substrate 101. In this step, a reset gate, an amplifying gate, and the like, which are not shown in the figure, are also formed by the same process. Subsequently, a diffusion layer such as an extension region is optionally formed, and an insulating sidewall 7 is then formed on each sidewall of the transfer gate (gate electrode) 5.

Subsequently, an N-type diffusion layer 103 is formed in a surface layer of one side of the P-well diffusion layer 102 separated by the transfer gate 5 by ion implantation and subsequent heat treatment. Thus, a diode D including the P-well diffusion layer 102 and the N-type diffusion layer 103 is formed on the surface side of the semiconductor substrate 101. A floating diffusion portion 105 composed of an N-type diffusion layer is formed in the surface layer of the other side of the P-well diffusion layer 102 separated by the transfer gate 5 by ion implantation and subsequent heat treatment. Furthermore, by the same step as that described above, for example, driving transistors constituting a drive circuit are formed in a peripheral region disposed around an imaging area where the pixel regions are arranged.

Figure 3B:
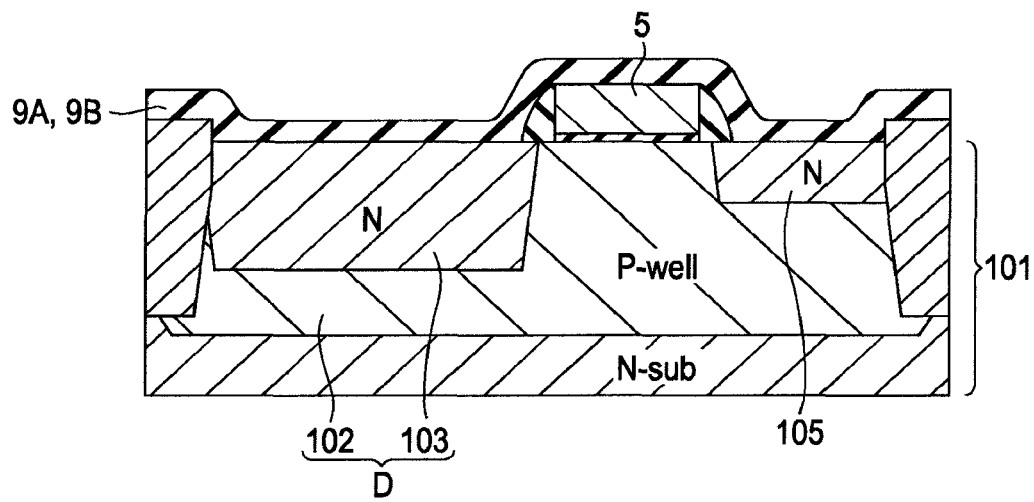

Next, as shown in FIG. 3B, an oxide insulating film 9A is deposited on the semiconductor substrate 101 on which the transfer gate 5, the diode D, the floating diffusion portion 105, and the driving transistors are provided.

To form the above-mentioned oxide insulating film 9A containing carbon and composed of a metal oxide, a deposition method using an organometallic gas as a material gas is preferably employed. Examples of such a deposition method include a metal-organic chemical vapor deposition (MOCVD) method and an atomic layer deposition (ALD) method. By employing these methods, an oxide insulating film 9A in which damage to the semiconductor substrate 101 is suppressed can be formed.

Furthermore, in depositing an oxide insulating film 9A whose carbon concentration has a gradient as described above, deposition by the MOCVD method or the ALD method mentioned above is performed first, and deposition by a physical vapor deposition (PVD) method such as a sputtering method may then be performed. By performing such a deposition by a PVD method, a film deposition rate of the entire layer of the oxide insulating film 9A can be increased.

As an example, deposition conditions for the ALD method are as follows:

Temperature of substrate for deposition: 200° C. to 500° C.
Organometallic gas flow rate: 10 to 500 sccm
Exposure time of organometallic gas: 1 to 15 sec.
Ozone gas flow rate: 10 to 500 sccm
Exposure time of ozone gas: 1 to 15 sec.

Meanwhile, deposition conditions for the MOCVD method are as follows:

Temperature of substrate for deposition: 200° C. to 600° C.

In the above mentioned film deposition method using an organometallic gas, deposition is performed so that the concentration of carbon contained in the oxide insulating film 9A is in the range of $6 \times 10^{19}$ to $5 \times 10^{21}$ atoms/cm$^3$ by controlling the flow rate ratio of the material gas (organometallic gas) containing carbon and the deposition temperature.

Deposition conditions for the PVD method that is subsequently performed are as follows.

Figure 3C:
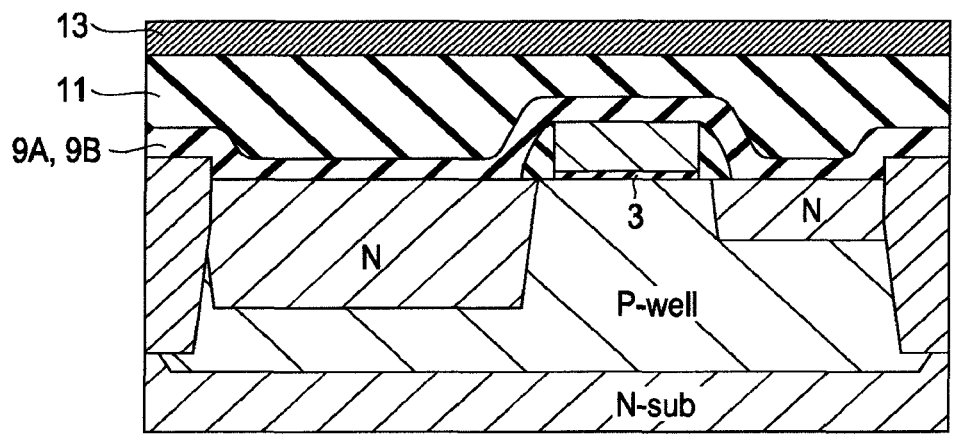

Pressure in deposition chamber: 0.01 to 50 Pa
DC power: 500 to 2,000 W
Argon (Ar) flow rate: 5 to 50 sccm
Oxygen ($O_2$) flow rate: 5 to 50 sccm Subsequently, as shown in FIG. 3C, an insulating film 11 composed of silicon oxide ($SiO_2$) or the like is formed on the oxide insulating film 9A. This insulating film 11 is formed, for example, so as to have a flat surface. A light-shielding film 13 composed of a material having a good light-absorbing property, such as tungsten (W), is then formed on the insulating film 11. According to this structure, since the oxide insulating film 9A is covered with the insulating film 11, a reaction caused by a direct contact between the oxide insulating film 9A and the light-shielding film 13 can be suppressed.

Figure 4A:
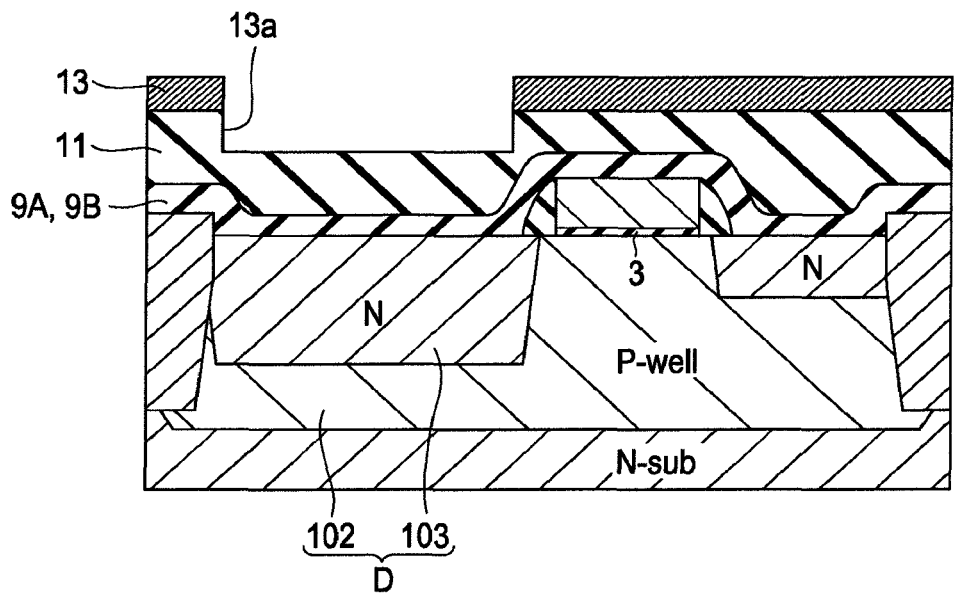
FIGS. 4A and 4B are cross-sectional process views (part 2) showing the method of producing the solid-state imaging device of the first embodiment and the second embodiment.

Next, as shown in FIG. 4A, an opening 13a for opening a position corresponding to the diode D is formed in the light-shielding film 13. In this embodiment, the light-shielding film 13 is pattern-etched using, for example, a resist pattern (not shown) as a mask to form the opening 13a above the diode D. In this step, the insulating film 11 functions as an etching stopper, thereby preventing the oxide insulating film 9A from being exposed to etching.

Figure 4B:
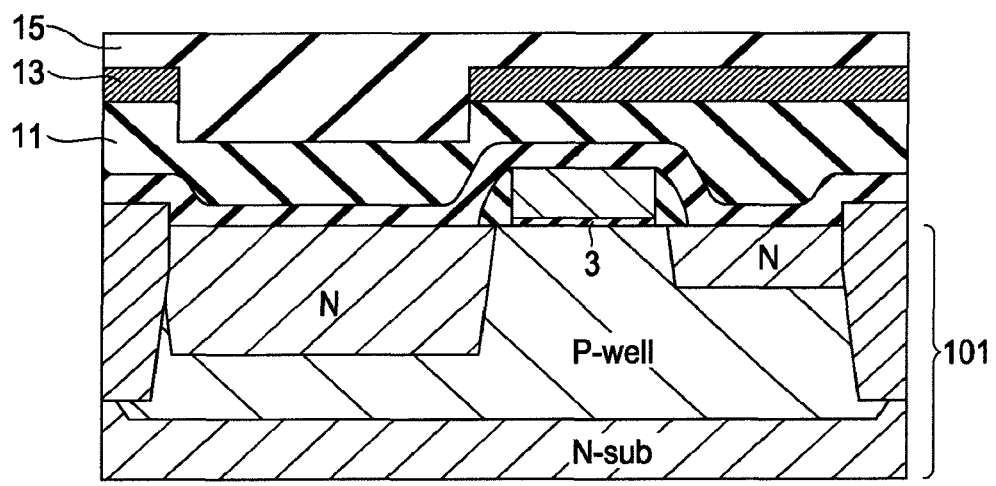

Next, as shown in FIG. 4B, a planarizing insulating film 15 for decreasing the difference in level due to the presence of the light-shielding film 13 is formed. This planarizing insulating film 15 is composed of, for example, silicon oxide, and is formed by application so as to have a flat surface.

Subsequently, as shown in FIG. 1A, a color filter layer 17 is pattern-formed so as to correspond to each pixel on the planarizing insulating film 15, and an on-chip lens 19 is further formed on the color filter layer 17.

In the solid-state imaging device 1A having the structure shown in FIGS. 1A and 1B obtained as described above, the oxide insulating film 9A containing carbon is provided on the diode D. The oxide insulating film 9A containing carbon functions as a negative-charge accumulation layer having a negative fixed charge. Consequently, by providing the oxide insulating film 9A on the sensor (diode D), positive charges are efficiently attracted to the surface side of the semiconductor substrate 101 by a negative band-bending effect in the oxide insulating film 9A. Consequently, a hole accumulation layer 107 is formed in this portion, and thus an interface state can be compensated for. In particular, the amount of negative fixed charge in the oxide insulating film 9A is controlled by the carbon concentration as described with reference to FIG. 2. Accordingly, the hole accumulation layer 107 can be reliably formed on the surface side of the semiconductor substrate 101 by a sufficient band-bending effect.

Accordingly, generation of dark current can be prevented by constituting the HAD structure without providing on a surface of the diode D a hole accumulation layer composed of an impurity diffusion layer which is formed by performing a heat treatment at a high temperature. As a result, the diode D can be provided at a shallow position in the surface of the semiconductor substrate 101, thereby increasing a transfer efficiency of charges to the floating diffusion portion 105 which is disposed at a side of the diode D with the transfer gate 5 provided between the diode D and the floating diffusion portion 105.

Second Embodiment
(Embodiment in which Oxide Insulating Film is Composed of Silicon-Based Material)
[Structure of Solid-State Imaging Device]

A solid-state imaging device of a second embodiment differs from the solid-state imaging device 1A of the first embodiment described with reference to FIGS. 1A and 1B in the structure of the oxide insulating film, and the other structures of these solid-state imaging devices are the same as each other. The structure of a solid-state imaging device 1B of the second embodiment will now be described with reference to FIGS. 1A and 1B.

Specifically, in the solid-state imaging device 1B of this second embodiment, a semiconductor substrate 101 including element isolations 101a, a transfer gate 5, a diode D, a floating diffusion portion 105, and transistors constituting a drive circuit is covered with an oxide insulating film 9B composed of a silicon-based material. This oxide insulating film 9B contains carbon, and accordingly, as in the first embodiment, the oxide insulating film 9B is provided as a negative-charge accumulation layer having a negative fixed charge.

The oxide insulating film 9B is composed of a silicon-based material such as silicon oxide ($SiO_2$). Among silicon-based materials, a material having a negative fixed charge in itself is preferable. Specifically, a silicon oxide film containing an impurity selected from boron and phosphorus is preferably used. Specific examples thereof include silicon oxide containing boron (borosilicate glass (BSG)), silicon oxide containing phosphorus (phosphosilicate glass (PSG)), and silicon oxide containing boron and phosphorus (borophosphosilicate glass (BPSG)).

Figure 5:
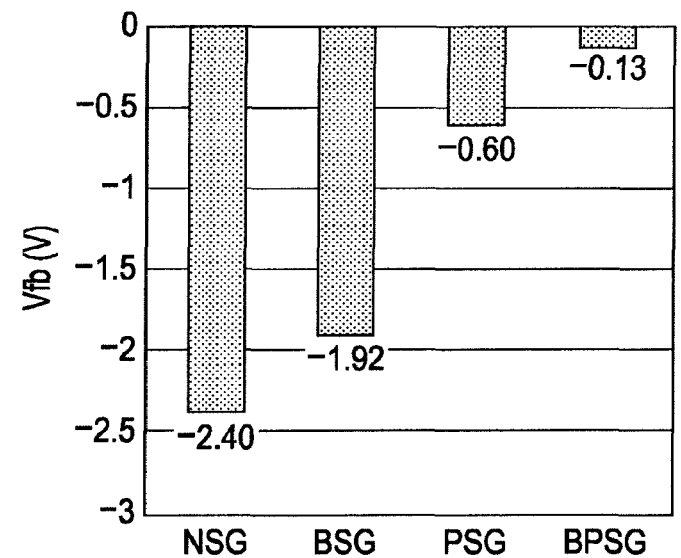
FIG. 5 is a graph showing the flat-band voltage (Vfb) in various silicon-based oxide insulating films.

FIG. 5 shows the flat-band voltage (Vfb) in a silicon oxide film not containing an impurity (non-doped silicate glass (NSG) film), a BSG film, a PSG film, and a BPSG film. Each of these films was deposited using a semi-atmosphere CVD (SA-CVD) method by changing only the flow rate ratio of a film deposition gas containing phosphorus or boron and maintaining the other conditions to be the same. The deposition temperature was 480° C.

As shown in FIG. 5, it is confirmed that the flat-band voltage (Vfb) in the BSG film, the PSG film, and the BPSG film, all of which contain an impurity selected from boron, phosphorus etc. is shifted to the positive side, as compared with the NSG film, which does not contain an impurity. This result shows that, by incorporating an impurity selected from boron, phosphorus etc. in a silicon oxide film, a positive fixed charge in the film is decreased and a negative fixed charge is increased. In addition, the amount of such an increase in the negative fixed charge is the largest in BPSG, the second largest in PSG, and the third largest in BSG. However, the content of an impurity selected from phosphorus, boron etc. in such a silicon-based oxide insulating film 9B is in the range of 0 to 10 percent by weight.

The concentration of carbon contained in the oxide insulating film 9B is preferably $6 \times 10^{19}$ atoms/cm$^3$ or more. Accordingly, a sufficient amount of negative fixed charge is accumulated in the oxide insulating film 9B. The upper limit of the concentration of carbon contained in the oxide insulating film 9B is a range in which the amount of negative charge accumulation can be controlled by the carbon concentration, for example, $5 \times 10^{21}$ atoms/cm$^3$ or less.

Note that it is sufficient that such an oxide insulating film 9B contains carbon at least on the side that contacts the semiconductor substrate 101 (i.e., in the lower layer), and the upper layer may not contain carbon. That is, as in the first embodiment, in the oxide insulating film 9B, the carbon concentration may have a gradient, and it is sufficient that the carbon concentration is controlled on the side that contacts the semiconductor substrate 101 (i.e., in the lower layer).

As described above, as in the first embodiment, by providing the oxide insulating film 9B as a negative-charge accumulation layer, the semiconductor substrate 101 is in a state in which a hole accumulation layer 107 to which positive charges are attracted is formed in a surface layer of the diode D.

Furthermore, as in the first embodiment, a light-shielding film 13 is provided on the oxide insulating film 9B with, for example, an insulating film 11 having a flat surface therebetween. Furthermore, a planarizing insulating film 15, a color filter layer 17, and an on-chip lens 19 are provided thereon in that order.

[Method of Producing Solid-State Imaging Device]

A method of producing the solid-state imaging device 1B of the second embodiment having the above structure may be the same as the method of producing the solid-state imaging device of the first embodiment described with reference to the cross-sectional process views of FIG. 3A to 4B except for the step of forming the oxide insulating film 9B.

Specifically, first, as shown in FIG. 3A, trench element isolations 101a are formed on a surface side of a semiconductor substrate 101 composed of N-type single-crystal silicon to isolate each pixel region. A P-well diffusion layer 102 is then formed. Subsequently, a transfer gate 5 is pattern-formed, with a gate insulating film 3 therebetween, so as to intersect the P-well diffusion layer 102. An insulating sidewall 7 is then formed on each sidewall of the transfer gate 5. Next, an N-type diffusion layer 103 is formed in a surface layer of one side of the P-well diffusion layer 102 separated by the transfer gate 5 to form a diode D including the P-well diffusion layer 102 and the N-type diffusion layer 103. A floating diffusion portion 105 composed of an N-type diffusion layer is formed in a surface layer of the other side of the P-well diffusion layer 102 separated by the transfer gate 5. Furthermore, by the same step as that described above, for example, driving transistors constituting a drive circuit are formed in a peripheral region disposed around an imaging area where the pixel regions are arranged.

Next, as shown in FIG. 3B, an oxide insulating film 9B is deposited on the semiconductor substrate 101 on which the transfer gate 5, the diode D, the floating diffusion portion 105, and the driving transistors are provided.

To form the above-mentioned oxide insulating film 9B containing carbon and composed of a silicon-based material, a CVD method using tetraethoxysilane (TEOS) gas, which is a carbon-containing gas, is employed. In particular, an SA-CVD method using ozone ($O_3$) gas together with TEOS gas is preferably employed. By employing this deposition method, an oxide insulating film 9B in which damage to the semiconductor substrate 101 is suppressed can be formed, and furthermore, a good embedding characteristic can also be achieved.

Furthermore, in depositing an oxide insulating film 9B whose carbon concentration has a gradient as described above, deposition by the above-mentioned CVD method using TEOS gas is performed first, and deposition by a physical vapor deposition (PVD) method such as a sputtering method may then be performed. By performing such a deposition by a PVD method, a film deposition rate of the entire layer of the oxide insulating film 9B can be increased.

In the above-described CVD method using TEOS gas, deposition is performed so that the concentration of carbon contained in the oxide insulating film 9B is in the range of $6 \times 10^{19}$ to $5 \times 10^{21}$ atoms/cm$^3$ by controlling the flow rate ratio of TEOS gas containing carbon and the deposition temperature.

Figure 6:
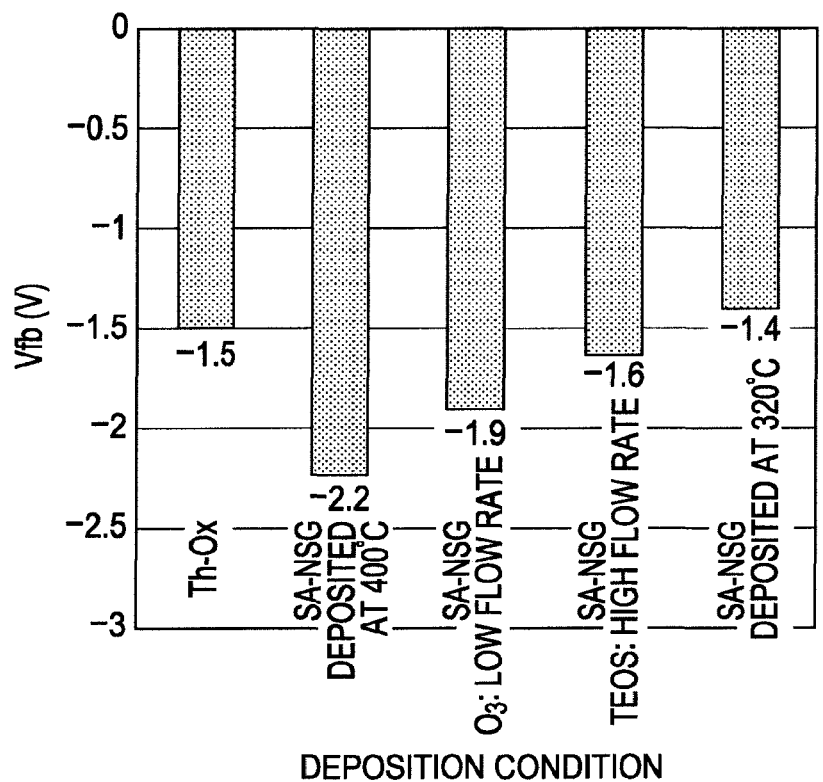
FIG. 6 is a graph showing the relationship between conditions for deposition of a silicon-based oxide insulating film and the flat-band voltage (Vfb)

FIG. 6 is a graph showing the relationship between deposition conditions and the flat-band voltage (Vfb) when NSG is deposited by a CVD method using TEOS gas. In this embodiment, deposition was performed using a semi-atmosphere CVD (SA-CVD) method by changing the deposition temperature or a flow rate ratio $O_3$/TEOS and maintaining the other conditions to be the same. For comparison, the flat-band voltage (Vfb) of a thermally oxidized film is also shown in the graph.

As shown in FIG. 6, it was confirmed that the flat-band voltage (Vfb) is shifted to the positive side with a decrease in the deposition temperature and an increase in the flow rate ratio of TEOS. This result shows that as the deposition temperature decreases and the flow rate ratio of TEOS increases, a positive fixed charge in the film decreases and a negative fixed charge increases, and in addition, the carbon concentration in the film also increases. Accordingly, in the CVD method using TEOS gas, the carbon concentration in the oxide insulating film 9B is controlled by controlling the flow rate ratio of TEOS gas, which contains carbon, and the deposition temperature.

Deposition conditions for the silicon-based oxide insulating film 9B by such a CVD method using TEOS gas are set to the following ranges:

Temperature of substrate for deposition: 250° C. to 350° C.

TEOS flow rate: 50 to 250 mg/min.
$O_3$ flow rate: 250 to 10,000 sccm
$O_3$/TEOS flow rate ratio: 5 to 40
TEB (triethyl borate) flow rate: 0 to 200 mg/min.
TEPO (triethyl phosphate) flow rate: 0 to 100 mg/min.

The pressure in a deposition atmosphere, the type of carrier gas, and the carrier gas flow rate are appropriately selected.

The subsequent steps are performed as in the first embodiment.

Specifically, as shown in FIG. 3C, an insulating film 11 is formed on the oxide insulating film 9B so as to have a flat surface. A light-shielding film 13 composed of a material having a good light-absorbing property is further formed on the insulating film 11. Subsequently, as shown in FIG. 4A, an opening 13a for opening a position corresponding to the diode D is then formed in the light-shielding film 13.

Next, as shown in FIG. 4B, a planarizing insulating film 15 for decreasing the difference in level due to the presence of the light-shielding film 13 is formed.

Subsequently, as shown in FIG. 1A, a color filter layer 17 is pattern-formed so as to correspond to each pixel on the planarizing insulating film 15, and an on-chip lens 19 is further formed on the color filter layer 17.

In the solid-state imaging device 1B having the structure shown in FIGS. 1A and 1B obtained as described above, the silicon-based oxide insulating film 9B containing carbon is provided on the diode D. The silicon-based oxide insulating film 9B containing carbon functions as a negative-charge accumulation layer having a negative fixed charge. Consequently, by providing the oxide insulating film 9B on the sensor (diode D), positive charges are efficiently attracted to the surface side of the semiconductor substrate 101 by a negative band-bending effect in the oxide insulating film 9B. Consequently, a hole accumulation layer 107 is formed in this portion, and thus an interface state can be compensated for. In particular, the amount of negative fixed charge in the oxide insulating film 9B is controlled by the carbon concentration. Accordingly, the hole accumulation layer 107 can be reliably formed on the surface side of the semiconductor substrate 101 by a sufficient band-bending effect. In addition, by incorporating an impurity such as boron or phosphorus in the oxide insulating film 9B, the amount of negative fixed charge in the oxide insulating film 9B can be increased, and the hole accumulation layer 107 can be formed more reliably.

Accordingly, as in the first embodiment, generation of dark current can be prevented by constituting the HAD structure without providing on a surface of the diode D a hole accumulation layer composed of an impurity diffusion layer which is formed by performing a heat treatment at a high temperature. As a result, the diode D can be provided at a shallow position in the surface of the semiconductor substrate 101, thereby increasing a transfer efficiency of charges to the floating diffusion portion 105 which is disposed at a side of the diode D with the transfer gate 5 provided between the diode D and the floating diffusion portion 105.

Modification
(Embodiment in which Hole Accumulation Region Composed of Impurity Diffusion Layer is Provided)
[Structure of Solid-State Imaging Device]

Figure 7A:
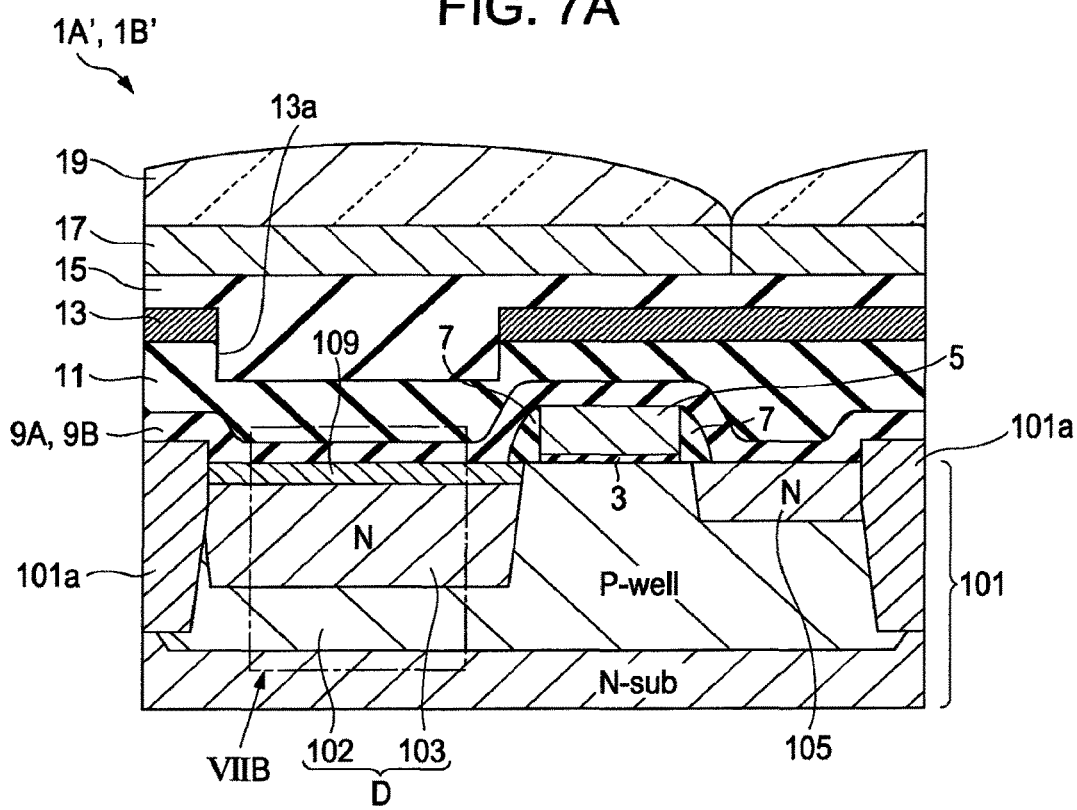
FIGS. 7A and 7B are cross-sectional views of relevant parts illustrating a modification of the first embodiment and the second embodiment.
Figure 7B:
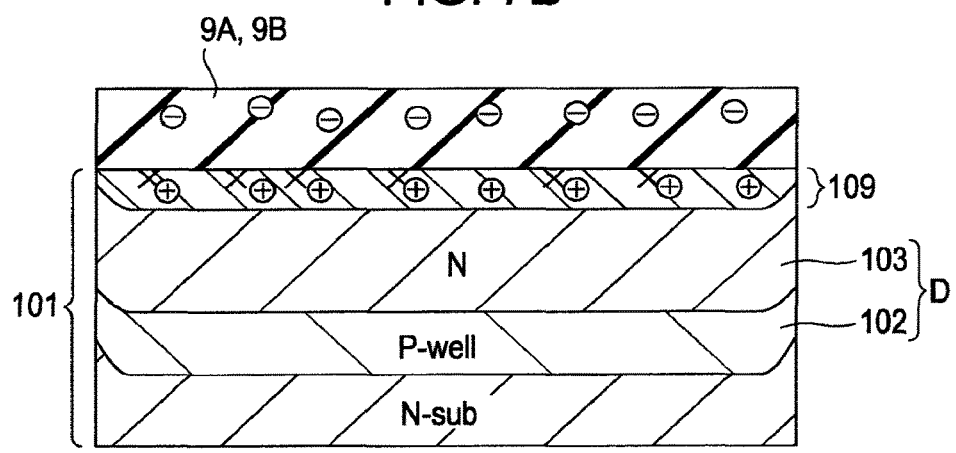
Figure 8A:
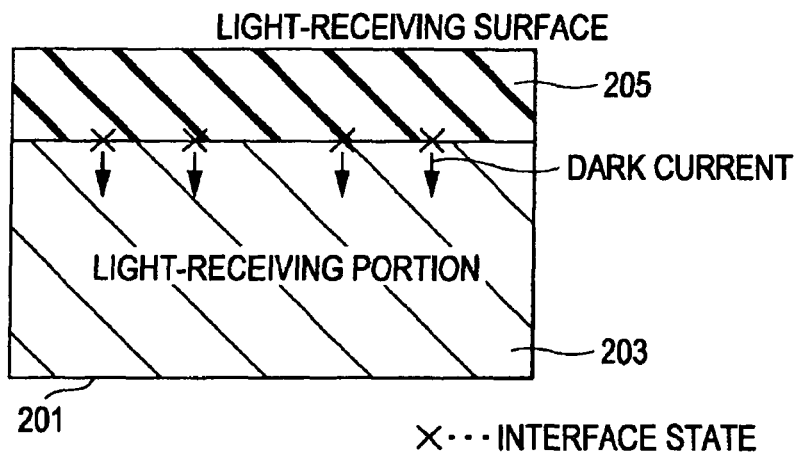
FIGS. 8A and 8B are cross-sectional views of relevant parts illustrating the structures of solid-state imaging devices in the related art.
Figure 8B:
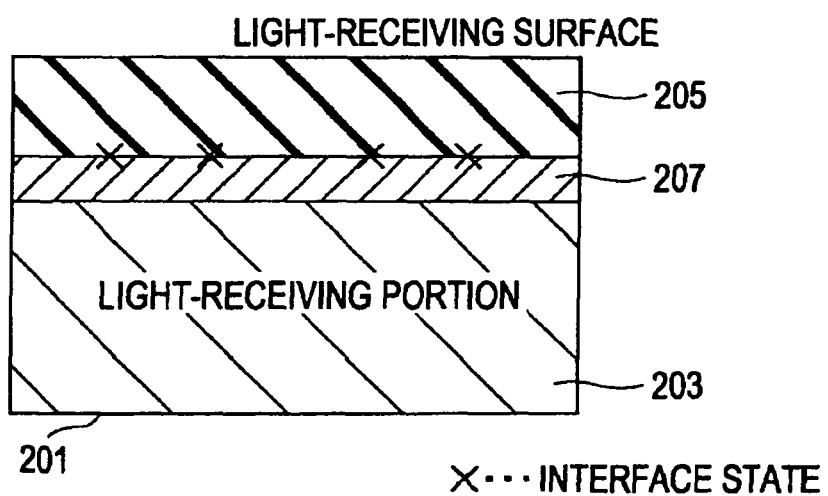

FIGS. 7A and 7B show a modification of a solid-state imaging device of the first embodiment and the second embodiment. More specifically, FIGS. 7A and 7B show an example in which a positive-charge accumulation layer 109 composed of an impurity diffusion layer is provided on a surface of a diode D. Other structures are the same as those of the solid-state imaging device of the first embodiment and the second embodiment.

The positive-charge accumulation layer 109 provided in a solid-state imaging device 1A' or 1B' is a layer formed by diffusing a p-type impurity in a top surface of a semiconductor substrate 101, i.e., a top surface of an N-type diffusion layer 103 constituting the diode D.

[Method of Producing Solid-State Imaging Device]

In producing the solid-state imaging device 1A' or 1B' having the above structure, the diode D is formed as described with reference to FIG. 3A in the first embodiment and the second embodiment, and a step of forming the hole accumulation layer 109 is then performed by introducing a P-type diffusion layer in a surface of the diode D. The subsequent steps can be performed as in the first embodiment and the second embodiment.

According the solid-state imaging device 1A' or 1B' having the above structure, the amount of positive fixed charge in the hole accumulation layer 109 composed of the impurity diffusion layer can be increased by a negative band-bending effect in the oxide insulating film 9A or 9B. Accordingly, even when the hole accumulation layer 109 composed of the impurity diffusion layer has a low impurity concentration and the depth of the hole accumulation layer 109 is shallow, because of an assist of a negative band-bending effect in the oxide insulating film 9A or 9B, generation of dark current can be prevented by a sufficient amount of fixed charge.

The present application contains subject matter related to that disclosed in Japanese Priority Patent Application JP 2008-231780 filed in the Japan Patent Office on Sep. 10, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of producing a solid-state imaging device, the method comprising:
depositing an oxide of a metal onto a semiconductor substrate by performing a deposition process in a manner that forms an oxide insulating film on the semiconductor substrate,
wherein the deposition process deposits the oxide of the metal in a manner that the oxide insulating film on the semiconductor substrate has a concentration of carbon in the oxide of the metal that is greater at a lower layer of the oxide insulating film than at an upper layer of the oxide insulating film,
wherein the deposition process uses a material gas, the material gas is an organometallic gas that contains carbon,
wherein the deposition process is an atomic layer deposition (ALD) method, deposition conditions for the atomic layer deposition (ALD) method are as follows:
temperature of the semiconductor substrate: 200° C. to 600° C.,
the organometallic gas flow rate: 10 to 500 sccm,
exposure time of the organometallic gas: 1 to 15 sec.,
ozone gas flow rate: 10 to 500 sccm, and
exposure time of the ozone gas: 1 to 15 sec.

2. The method according to claim 1, wherein the metal is from a group consisting of hafnium, zirconium, aluminum, titanium, and tantalum.

3. The method according to claim 1, wherein the concentration of carbon is $6\times10^{19}$ atoms/cm$^3$ or more.

4. The method according to claim 1, wherein the concentration of carbon is $5\times10^{21}$ atoms/cm$^3$ or less.

5. The method according to claim 1, wherein the concentration of carbon is in a range of $6\times10^{19}$ atoms/cm$^3$ to $5\times10^{21}$ atoms/cm$^3$.

6. The method according to claim 1, wherein a flow rate ratio of the material gas and a deposition temperature are controlled during the deposition process.

7. The method according to claim 1, wherein the deposition process performs a sputtering method after using the material gas.

8. The method according to claim 1, wherein the deposition process includes a sputtering method.

9. The method according to claim 1, wherein the deposition process includes a physical vapor deposition (PVD) method.

10. A method of producing a solid-state imaging device, the method comprising:
depositing an oxide of a metal onto a semiconductor substrate by performing a deposition process in a manner that forms an oxide insulating film on the semiconductor substrate,
wherein the deposition process deposits the oxide of the metal in a manner that the oxide insulating film on the semiconductor substrate has a concentration of carbon in the oxide of the metal that is greater at a lower layer of the oxide insulating film than at an upper layer of the oxide insulating film, and
wherein the deposition process includes a physical vapor deposition (PVD) method, deposition conditions for the physical vapor deposition (PVD) method are as follows:
pressure in a deposition chamber: 0.01 to 50 pa,
dc power: 500 to 2,000 w,
argon (ar) flow rate: 5 to 50 sccm, and
oxygen (O$_2$) flow rate: 5 to 50 sccm.

11. The method according to claim 10, wherein the metal is from a group consisting of hafnium, zirconium, aluminum, titanium, and tantalum.

12. The method according to claim 10, wherein the concentration of carbon is $6\times10^{19}$ atoms/cm$^3$ or more.

13. The method according to claim 10, wherein the concentration of carbon is $5\times10^{21}$ atoms/cm$^3$ or less.

14. The method according to claim 10, wherein the concentration of carbon is in a range of $6\times10^{19}$ atoms/cm$^3$ to $5\times10^{21}$ atoms/cm$^3$.

15. The method according to claim 10, wherein the deposition process uses a material gas, the material gas is an organometallic gas that contains carbon.

16. The method according to claim 15, wherein a flow rate ratio of the material gas and a deposition temperature are controlled during the deposition process.

17. The method according to claim 10, wherein the deposition process performs a sputtering method after using the material gas.

18. The method according to claim 10, wherein the deposition process includes a sputtering method.

* * * * *